United States Patent
Lu et al.

(10) Patent No.: US 6,850,432 B2
(45) Date of Patent: Feb. 1, 2005

(54) LASER PROGRAMMABLE ELECTRICALLY READABLE PHASE-CHANGE MEMORY METHOD AND DEVICE

(75) Inventors: Chih-Yuan Lu, Hsin-Chu (TW); Yi-Chou Chen, Hsin-Chu (TW)

(73) Assignee: Macronix International Co., Ltd., Hsinchu (TW)

( * ) Notice: Subject to any disclaimer, the term of this patent is extended or adjusted under 35 U.S.C. 154(b) by 55 days.

(21) Appl. No.: 10/223,975

(22) Filed: Aug. 20, 2002

(65) Prior Publication Data

US 2004/0037106 A1 Feb. 26, 2004

(51) Int. Cl.$^7$ .............................................. G11C 11/00
(52) U.S. Cl. ..................... 365/163; 365/234; 365/237
(58) Field of Search ................................. 365/163, 234, 365/237

(56) References Cited

U.S. PATENT DOCUMENTS

| | | |
|---|---|---|
| 3,530,441 A | 9/1970 | Ovshinsky |
| 4,455,495 A | 6/1984 | Masuhara et al. |
| 4,633,445 A | 12/1986 | Sprague |
| 4,719,594 A | 1/1988 | Young et al. |
| 4,912,066 A | 3/1990 | Wills |
| 5,109,374 A * | 4/1992 | Tsunoda et al. ............ 369/100 |
| 5,789,277 A | 8/1998 | Zahorik et al. |
| 5,789,758 A | 8/1998 | Reinberg |
| 5,837,564 A | 11/1998 | Sandhu et al. |
| 5,912,839 A * | 6/1999 | Ovshinsky et al. .... 365/185.03 |
| 6,077,729 A | 6/2000 | Harshfield |
| 6,150,253 A | 11/2000 | Doan |
| 6,153,890 A | 11/2000 | Wolstenholme et al. |
| 6,185,122 B1 | 2/2001 | Johnson et al. |
| RE37,259 E | 7/2001 | Ovshinsky |
| 6,496,459 B2 * | 12/2002 | Ueki ....................... 369/47.53 |
| 6,707,698 B2 | 3/2004 | Fricke et al. |

* cited by examiner

*Primary Examiner*—Son T. Dinh
(74) *Attorney, Agent, or Firm*—Haynes Beffel & Wolfeld LLP (57) ABSTRACT

Roughly described, a phase-change memory such as a chalcogenide-based memory is programmed optically and read electrically. No complex electrical circuits are required for programming the cells. On the other hand, this memory can be read by electrical circuitry directly. The read out speed is much faster than for optical disks, and integrated circuit chips made this way are more compatible with other electrical circuits than are optical disks. Thus memories according to the invention can have simple, low power-consuming, electrical circuits, and do not require slow and power-hungry disk drives for reading. The invention therefore provides a unique low power, fast read/write memory with simple electrical circuits.

27 Claims, 8 Drawing Sheets

LASER PROGRAMMABLE ELECTRICALLY READABLE PHASE-CHANGE MEMORY METHOD AND DEVICE

BACKGROUND

Field of the Invention

The present invention relates to non-volatile, high density, integrated circuit memory devices, and more particularly to such memory devices based upon phase change materials such as chalcogenides.

References

The following documents are incorporated by reference herein: U.S. Pat. Nos. 5,837,564; 3,530,441; 4,912,066; 4,455,495; 4,719,594; 5,789,758; 6,077,729; 6,153,890; RE37,259; 5,687,112; 5,789,277; 6,185,122 and 6,150,253. PCT publication PCT/US00/33562. Noboru Yamada, "Potential of Ge—Sb—Te Phase-Change Optical Disks for High-Data-Rate Recording", SPIE v.3109, pp. 28–37 (1997).

Description of Related Art

Chalcogenides have been utilized in the formation of memory cells for integrated circuit memory devices. Representative prior art patents in this field include Reinberg U.S. Pat. No. 5,789,758, Harshfield U.S. Pat. No. 6,077,729, Wolstenholme U.S. Pat. No. 6,153,890, Ovshinsky U.S. Reissue Pat. No. RE37,259 (Reissue of U.S. Pat. No. 5,687,112), Zahorik U.S. Pat. No. 5,789,277, Doan U.S. Pat. No. 6,150,253, and many others.

Chalcogenides are materials that possess more than one solid-state phase, and which can be switched between such phases using the application of heat caused for example by electrical current or optical pulses. Memory cells which include a chalcogenide element typically are arranged in an array which can be addressed using conventional or novel word lines/bit line addressing schemes common in integrated circuit memories. The state of the memory cell is determined by the bulk resistance of the chalcogenide element. Because the different solid-state phases of the chalcogenide have different resistivity, the bulk resistance of the chalcogenide element indicates the amount of the chalcogenide element in a selected phase state.

In an electrically-programmed chalcogenide-based memory, high electrical current is typically required to program the memory. Often at least 1 mA of current is required to program one bit, though the read current requirements are much less stringent. In a standard MOS IC, it is very difficult to provide a source/drain current of more than 1 mA for a minimum size device. In addition, even if such feats were possible, the high power consumed would be very undesirable for many applications.

The problem of applying current at sufficient current densities to cause the phase change in the chalcogenide element also is reflected in the design of the memory cells. Typically, relatively complex structures are utilized to form small pores in the current path that is coupled to the chalcogenide element. Current is concentrated through the small pores to induce a locally high current density in the chalcogenide element. The complex structures utilized to form the pores, and other aspects of chalcogenide based memory cells, have required relatively large cell sizes to implement. Furthermore, complex structures can affect the reliability of the memory devices. Large cell sizes limit the density of the memory device, and increase its cost.

Chalcogenide materials also are widely used in read-write optical disks, in which laser pulses are used to switch between phases and to read the optical properties of the material after the phase change. Such read-write optical disks include such formats as CD-RW (CD-Rewritable), PD (Powerful Optical Disk System), and DVD-RAM (Digital Versatile Disk-RAM). The structure of these devices is simple and the cost of the disk is low, but it is necessary to prepare an optical system (e.g. DVD-RAM player) to read out the data. The optical system is quite large and expensive comparing to the disk. Moreover, it is slow and power consuming.

Accordingly, neither electrically-written and read chalcogenide memories nor optically-written and read chalcogenide memories are optimal. It would be desirable to provide a chalcogenide memory that can be read without the optical system required by optical disks but does not require the large programming current flow through the device as required by chalcogenide memories that are written and read electrically.

SUMMARY OF THE INVENTION

According to the invention, roughly described, a chalcogenide-based memory is programmed optically and read electrically. No complex electrical circuits are required for programming the cells. On the other hand, this memory can be read by electrical circuitry directly. The read out speed is much faster than for optical disks, and integrated circuit chips made this way are more compatible with other electrical circuits than are optical disks. Thus memories according to the invention can have simple, low power-consuming, electrical circuits, and do not require slow and power-hungry disk drives for reading. The invention therefore provides a unique low power, fast read/write memory with simple electrical circuits.

BRIEF DESCRIPTION OF THE DRAWINGS

The invention will be described with respect to specific embodiments thereof, and reference will be made to the drawings, in which.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

A chalcogenide material contains one or more elements from column six of the periodic table of elements. Many chalcogenide phase-change alloys have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. Ovshinsky '112 patent, cols 10–11. Particular alloys evaluated by another researcher include $Ge_2Sb_2Te_5$, $GeSb_2Te_4$ and $GeSb_4Te_7$. See the Yamada reference incorporated above. More generally, a transition metal such as Cr, Fe, Ni, Nb, Pd, Pt and mixtures or alloys thereof may be combined with Ge/Sb/Te to form a phase-change alloy that has programmable resistive properties. Specific examples of memory materials that may be useful are given in Ovshinsky '112 cols. 11–13, which examples are hereby incorporated by reference. Examples of memory materials include: Te—Ge—Sb—S, Te—Ge—As, Se—Ge—As, Se—Au—SiO$_2$, Se—SnO$_2$, Te, Sn—Te—Se, TeO$_x$, Te—Ge—Sn—O, Te—Ge—Sn, Se—Ge—Sn, Te—Se—Ga, Sb—Se—In, TeGeSnAu, Sb$_2$Se, GeTe, Te$_{89}$Ge$_2$Sn$_9$—M(M=Pt, Ni, Pd), TeSe—Sb, Bi—Se—Sb, Pd—Te—Ge—Sn, In—Se, GeTe—Sb$_2$Te$_3$ (Ge$_2$Sb$_2$Te$_5$, GeSb$_2$Te$_4$), Sb$_2$Te$_3$, Sb—Te, Te—Se-M (M=In, Sn, Sb), Te—Sn, Ga—Sb, In—Se—Tl, In—Se—Tl—Co, GeTe—SbSe, In—Sb—Te, InTe, In$_2$Te$_3$, In—Sb-M (M=Se, Te), Ag—Zn, GeTe—Sb$_2$Te$_3$—Sb, Sb$_2$S$_3$, In$_{47}$Se$_{51}$Pb$_2$, Au—Ge, Ge—Sb—Te—Tl—Ag GeSbTePd, Ge—Te—Ti, Sb$_{28}$Te$_{21}$Se$_{51}$, TeO$_x$ (M=Ge, Sn, Pd) (InSb)$_x$(GaSb)$_{1-x}$, Cu—Al, (In$_{43}$Sb$_{87}$)$_{1-x}$Ge$_x$, PbO, In$_3$SbTe$_2$, Ge—Sb, Se—Te—Ag, Cu—Ag, Cu—Al, Ag—Al, Cu—Al—Ag, Te—Ge—Sn, Ge—Te—Sb—Co, Ge—Ga—Te, In$_{1-x}$Se$_x$, Ge$_4$SbTe$_5$, Ge$_{10}$Sb$_{90}$, In—Sb—Te—Ag, In—Sb—Te—Ag-M (M=Ti, V), Cu—V—O, Sb—S—Ge, Au—Sn, In$_{46}$Sb$_{54}$, Sn—Sb—Se/Sb—Bi, GeTe—SbTe—Cr, Ge$_{30}$Sb$_{10}$S$_{60}$, Ga—Ge—Te, Ge$_{39}$Sb$_9$Te$_{52}$-M (M=Se, S, Sn, Si) As—Se—Te, Ge—As—S, GeTe—GeSe, Sb$_{0.93}$Ge0.07, (Sb$_2$Te$_3$)$_{1-x}$M$_x$ (M=Ag, Cu).

Phase-change materials are materials that are capable of being switched between a first structural state in which the material is generally amorphous and a second structural state in which the material is generally crystalline in its local order. These alloys are at least bistable. Phase change materials other than chalcogenides can be used with the invention. The term amorphous is used to refer to a relatively less ordered structure, more disordered than a single crystal, which has the detectable characteristics such as high electrical resistivity. The term crystalline is used to refer to a relatively more ordered structure, more ordered in an amorphous structure, which has detectable characteristics such as lower electrical resistivity than the amorphous state. Typically, phase-change materials may be switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly, and any number if electrically-distinguishable states can be defined within the gray scale in various embodiments.

Figure 1:
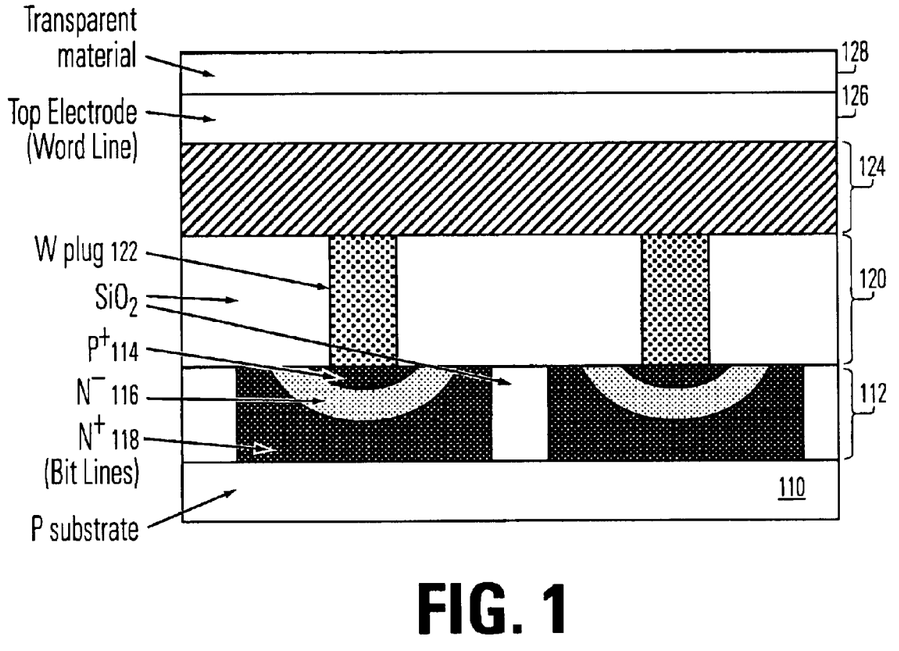
FIG. 1 is a cross-section of two chalcogenide memory cells according to the invention.

FIG. 1 is a cross-section of two typical chalcogenide memory cells side-by-side. On a P-type substrate 110 there is formed a silicon dioxide layer 112 containing memory cell selection circuits. The memory cell selection circuit can be any of a variety of kinds, for example MOSFET, P-N junction, or Schottky junction. In FIG. 1 a P-N junction diode is shown. From top to bottom it comprises a P+ layer 114, an N– layer 116, and an N+ layer 118 forming the bit lines. Above the memory cell selection layer 112 is a silicon dioxide layer 120 in which there is formed a conductor (for example a tungsten plug 122) connecting the top terminal 114 (anode) of the memory cell selection circuit to a superposing layer 124 of phase change film, such as a chalcogenide. The phase change film might be deposited, for example, in amorphous form, although in another embodiment it can be deposited in a crystalline form. The phase change film might be a continuous layer, in one embodiment, or in another embodiment it might be patterned to electrically isolate the region of phase change material of each memory cell from the regions for all other memory cells. Above the layer 124 of phase change material is the top electrode 126, which is used to form the word lines. The top electrode layer 126 preferably is optically transparent, at least at the wavelengths of the laser that will be used to program the phase change layer. Indium tin oxide (ITO) is a satisfactory material for the top electrode layer 126. The chip is then coated with a top layer 128 of transparent protective material such as glass. A memory cell in the embodiment of FIG. 1 is defined by the vertical stack including one of the diodes, the tungsten plug above the diode, and the region of chalcogenide material above the tungsten plug.

The phase change material in layer 124 has at least two solid phases that can be reversibly induced by heat from a laser beam. These at least two phases include an amorphous phase and a crystalline phase. The phase-change material possesses variable electrical resistance that changes depending on the phase of the material. For a chalcogenide, the ratio of the electrical resistance for amorphous and crystalline phases is usually more than $10^3$ times. Because of this resistance difference, digital data can be stored in the phase-change material. While various embodiments can rely on other electrically-detectable phase-dependent characteristics in the material other than resistance, resistance is preferred. Where resistance is the characteristic sensed, the material in layer 124 can be referred to more generally as a programmable resistive material. Note that in operation, the phase change material may not be fully converted to either an amorphous or crystalline phase. Intermediate phases or mixtures of phases may also be programmed which have an electrically-detectable difference in material characteristics. The two solid phases should generally be bistable and have different electrical properties.

Figure 2:
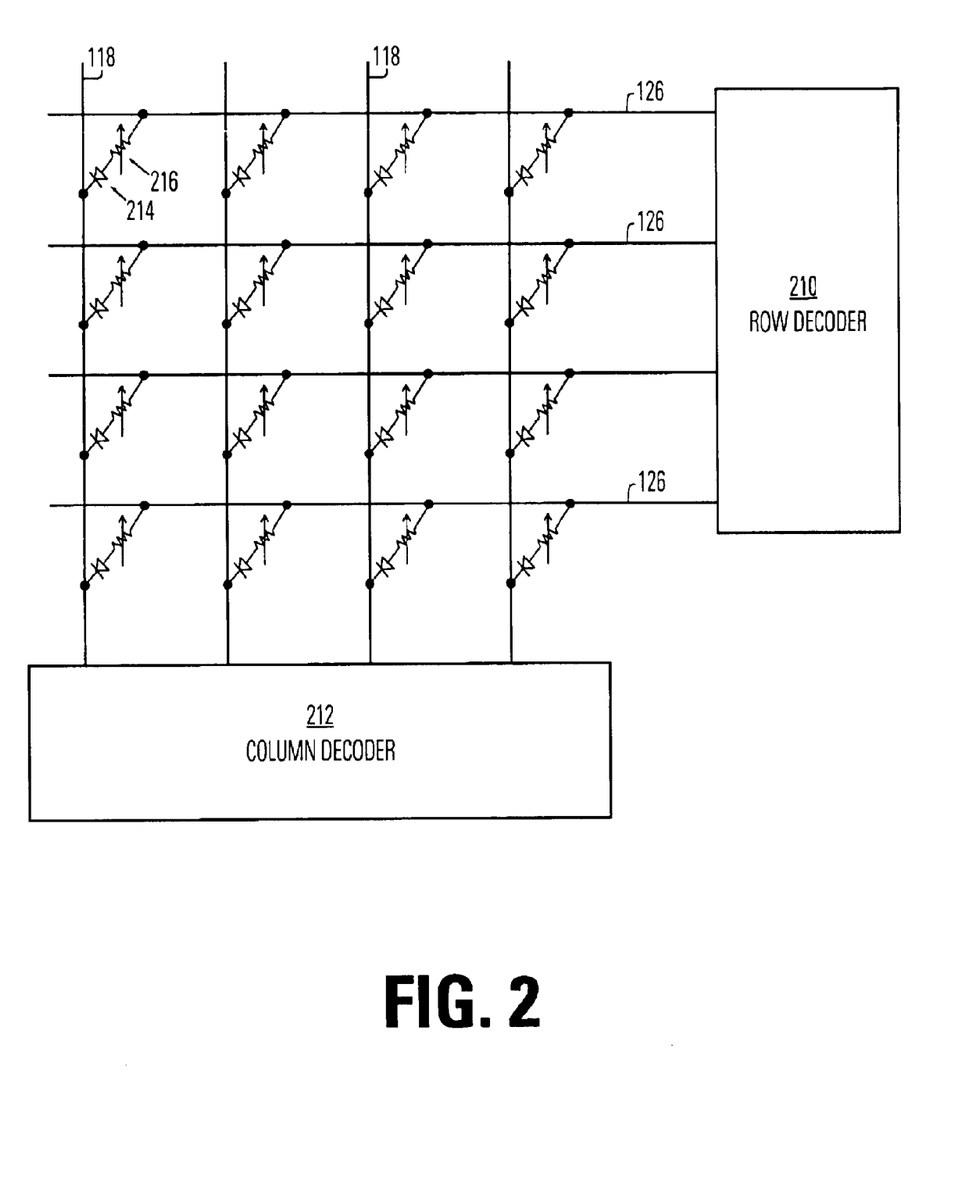
FIG. 2 is a schematic diagram of a memory cell array according to the invention.

FIG. 2 is a schematic diagram of a memory cell array after metal line patterning. The word lines 126 are shown horizontally in the figure whereas the bit lines 126 are shown vertically. The word lines are connected to a row decoder 210 and the bit lines are connected to a column decoder 212. The row and column decoders 210 and 212 comprise memory read circuitry for reading the value in selected memory cells, and may be made from any conventional or novel structures. Some example circuitry that can be used for this purpose is described in U.S. Pat. No. 6,185,122, or in PCT publication PCT/US00/33562, both incorporated by reference herein, although all of the circuitry for programming the cells in these references can be excluded. The memory cell appears electrically as a cell selection device (diode 214) in series with a variable resistor 216 representing the electrical path through the phase change layer from the word line 126 to the cell selection device. The resistance of this path depends on the phase that has been programmed into the phase-change material above the cell selection device (FIG. 1).

Phase-change alloys can be changed from one phase state to another by different heating processes. Regardless of the initial state, after heating the alloy to a temperature above Tm (the melting temperature) and quenching quickly, the phase becomes amorphous (high resistance). On the other hand, after heating and slow cooling, it becomes crystalline (low resistance). Alternatively, a shorter, higher amplitude pulse tends to change the phase-change material to a generally amorphous state, whereas a longer, lower amplitude pulse tends to change the phase-change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase-change alloy.

In the present embodiment, programming is accomplished by application of laser light to the region of phase change material for a particular memory cell. As used herein, the term "laser programming" means that the heating part of the programming step is accomplished at least in part by focusing a laser spot onto at least part of the phase change material. The cooling part can be accomplished by any method. In the present embodiment, the cooling part is accomplished passively, with no distinction being made according to the logic state being programmed into the cell. In such an embodiment, the nature of the heating part of the programming step is sufficient to determine the ultimate programmed state of the cell. In another embodiment, no distinction is made during the laser-based heating part of the programming step, and the ultimate programmed state of the cell is determined by the nature of the cooling part of the step. Other hybrid variations are also possible. All of these variations are considered herein to involve "laser programming."

Figure 3:
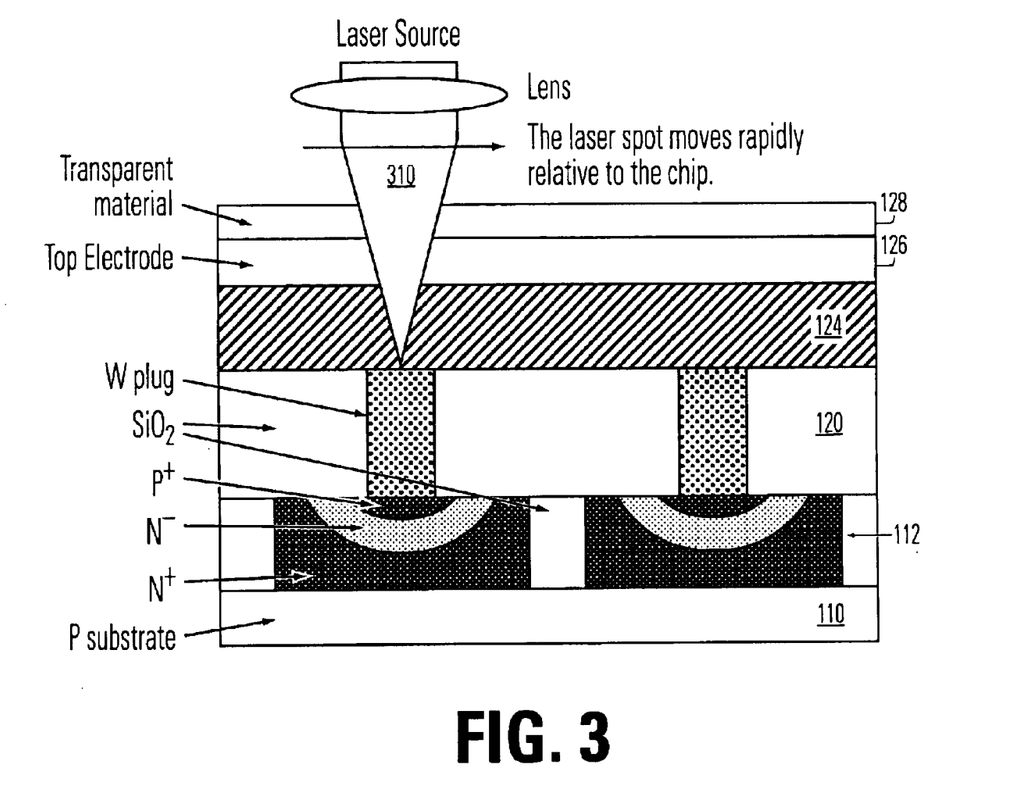
FIG. 3 illustrates a laser source scanning a laser spot across a row of cells according to the invention.

FIG. 3 illustrates a laser source scanning a laser spot 310 across a row of cells. At each cell position, if the value programmed into the cell is to be written, the laser is activated with either a shorter, higher power pulse to induce an amorphous phase in the region (high resistance), or a longer, lower power pulse to induce a crystalline phase in the region (lower resistance). In this way digital 0/1 data can be programmed into each cell. Note that what is important here about the scanning is the movement of the laser spot relative to the chip. This can be accomplished in different embodiments either by moving the laser spot and leaving the chip stationary, or by moving the chip and leaving the laser spot stationary, or by a combination of both kinds of motion.

Figure 4:
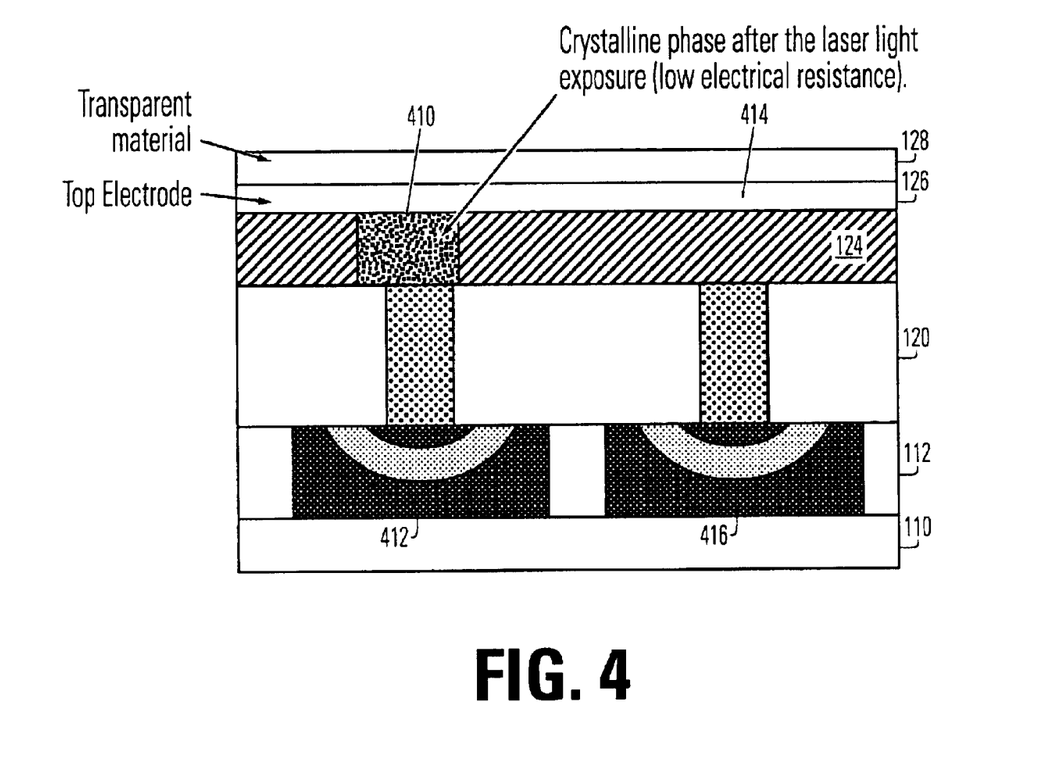
FIG. 4 illustrates the two memory cells of FIG. 1 after laser exposure.

FIG. 4 illustrates the two memory cells of FIG. 1 after laser exposure. In this example, the region 410 of phase change material positioned over memory cell selection circuit 412 received a longer, lower power laser pulse to induce a lower resistance crystalline phase in the region 410, whereas the region 414 of phase change material positioned over memory cell selection circuit 416 received either a shorter, higher power laser pulse (or no pulse at all if the region was already in the amorphous phase), to induce a higher resistance amorphous phase in the region 414. Thus the electrical path from the word line 126 to the cell selection diode 412 will have lower resistance than from the word line 126 to the cell selection diode 416.

Figure 5:
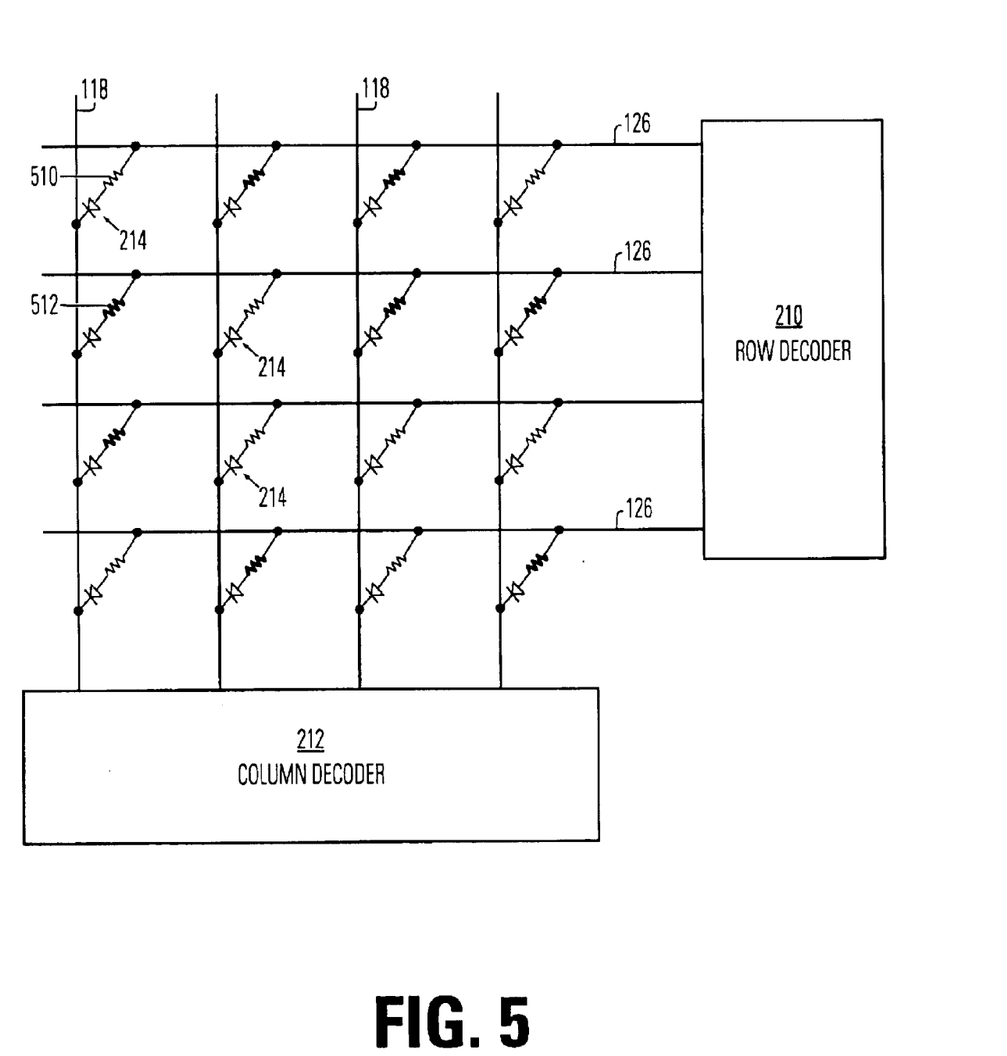
FIG. 5 is a schematic diagram of a memory cell array after laser programming.

FIG. 5 is a schematic diagram of a memory cell array after laser programming. In this diagram, a light-weight resistor such as resistor 510 indicates a higher resistance, whereas a heavy-weight resistor such as resistor 512 has a lower resistance. Cells that were programmed with a shorter, higher power pulse have amorphous material in the series path from the word line to the cell selection diode 214, thereby exhibiting a higher resistance, and cells that were programmed with a longer, lower power pulse have crystalline material in the series path from the word line to the cell selection diode 214, thereby exhibiting a lower resistance. These differences are sensed by the memory read circuitry 210, 212.

Figure 6:
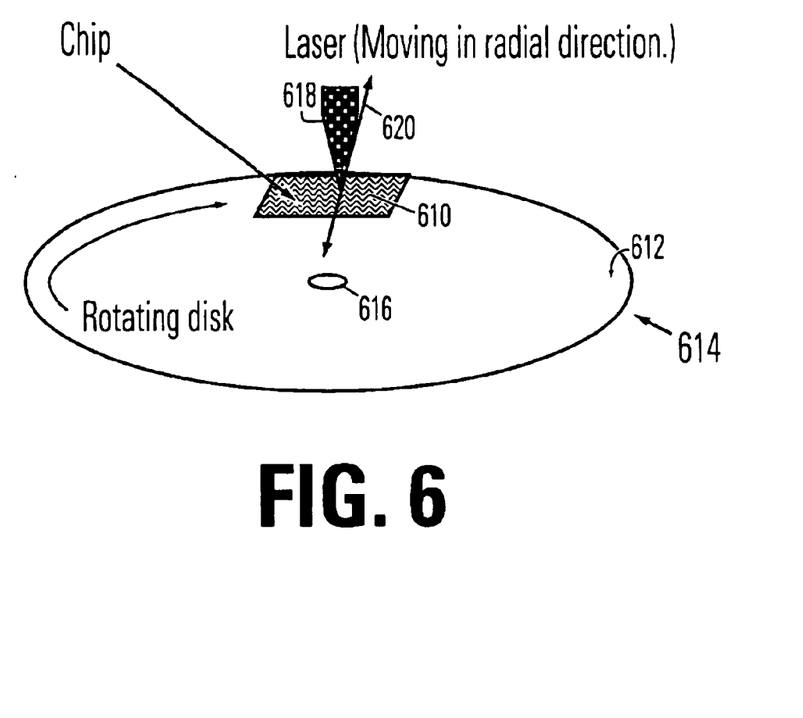
FIG. 6 illustrates a memory chip affixed to a rotatable disk.

An efficient way to scan a laser spot across numerous phase-change-based memory cells is by affixing the chip to a support that rotates relative to the laser source and the spot that it produces. FIG. 6 illustrates a memory chip 610 affixed to one of the major surfaces 612 of a disk 614 that rotates about an axis 616 essentially parallel to the laser beam 618. Although only one chip is shown, it will be appreciated that any number of memory chips can be affixed to the disk 614. The chip 610 is oriented so that a row or a column is substantially in-line with an arc of the disk, so that the laser spot will scan the complete row or column in the rotational dimension as the disk spins under the laser. In order to scan other rows (columns) on the chip, the laser source is adapted to move in a substantially radial dimension 620, much like the read/write head moves in conventional CD-RW disk drives.

Figure 7:
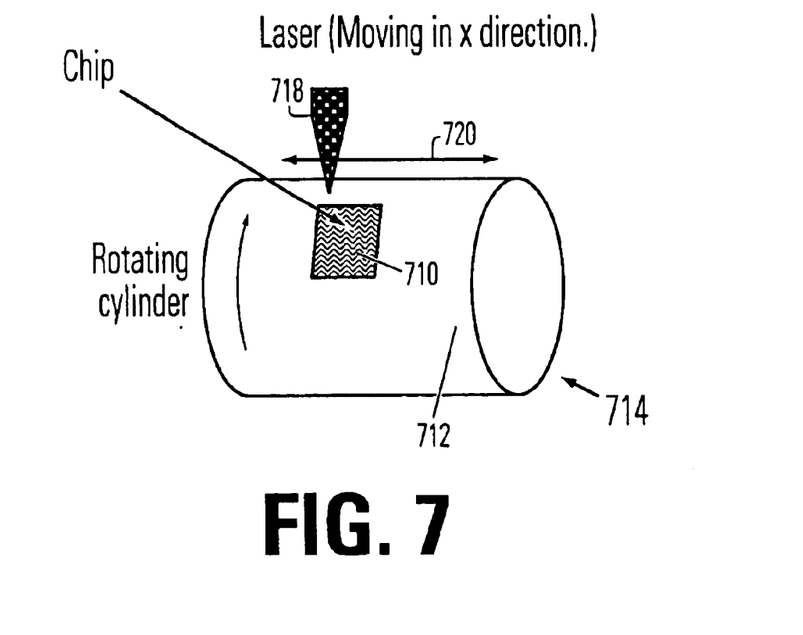
FIG. 7 illustrates a memory chip affixed to a cylinder.

In other embodiments, the support structure can rotate about axes that are not parallel to the laser beam. FIG. 7, for example, illustrates a memory chip 710 affixed to the cylindrical surface 712 of a cylinder 714 that rotates about an axis that is perpendicular to the laser beam 718. Again, although only one chip is shown, any number of memory chips can be affixed to the cylinder 714. The chip 710 is oriented so that a row or a column is substantially in-line with a circumference of the cylinder, so that the laser spot will scan the complete row or column in the rotational dimension as the cylinder spins under the laser. In order to scan other rows (columns) on the chip, the laser source is adapted to move in a substantially longitudinal dimension 720.

Preferably, in order to properly orient and time the laser scanning process, the memory chip array is organized into tracks and sectors, in much the same way as optical or magnetic disks. In one embodiment, an entire row or column across a chip constitutes a single sector, whereas in another embodiment, a row or column might contain several sectors. In yet another embodiment, with multiple chips affixed to the same rotating support, sectors and/or tracks continue across more than one of the chips.

Figure 8:
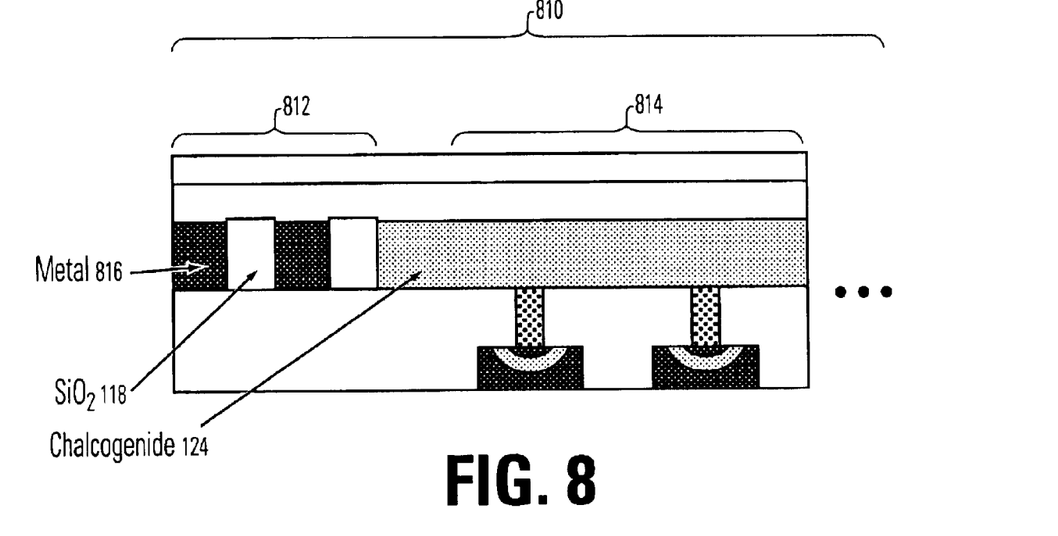
FIG. 8 illustrates a sector of memory cells preceded by an optically readable an address field.

Preferably each sector begins with sector address information that can be read during scanning. FIG. 8 illustrates a sector 810 of memory cells such as those in FIG. 1, aligned in a row, preceded by an address field 812 in-line with the row of cells 814. The address information is fabricated by any process that can form two optically differentiable markings in sequential address bit positions in the address field 812 in-line with the row of cells 814. For example, binary address bits can be formed as either a metal region 816 or a silicon dioxide region 818 in the same layer of the structure as the layer 124 of phase change material. The metal and silicon dioxide regions have different optical reflectivity which is detected by the laser scan, and therefore represent opposite binary values (1 or 0). In various embodiments the address information can be provided one per bit, one per byte, sector, track, or any other segment of data. The address information can carry absolute addresses (such as a sector number on the current track) or relative address (such as by simply marking each traversal of a predetermined number of bits), or by a combination of both. The address information is preferably contiguous on the track, but in another embodiment it can be spread along some length of track. Many other variations will be apparent.

Figure 9:
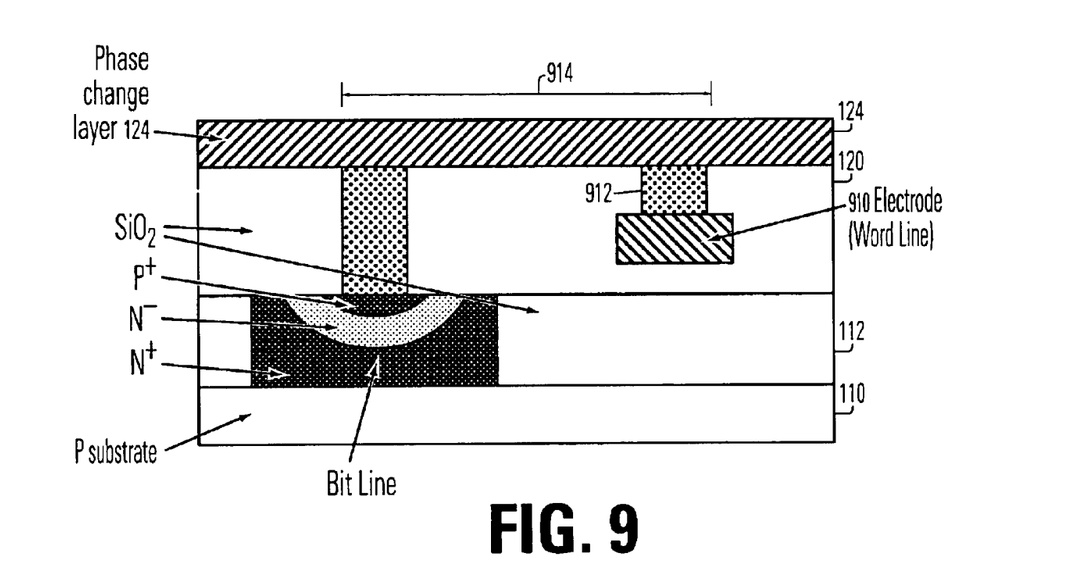
FIG. 9 illustrates another embodiment of a memory cell according to the invention.

The embodiments described herein are capable of many variations. In the embodiment of FIG. 1, for example, the word line metal is disposed above the layer 124 of phase change material. FIG. 9 illustrates another embodiment of a memory cell in which the word lines 910 are embedded in the silicon dioxide interconnect layer 120. A second tungsten plug 912 connects the word line 910 to the phase change layer 124. In this embodiment, the laser programs the cell by appropriately heating the entire region 914 of the phase change layer 124, extending across the two tungsten plugs, to induce the desired amorphous or crystalline structure.

In another variation, instead of using laser light to program fully packaged chips, i.e. programming each chip already packaged individually, the laser can be used to program the memory cells on the wafer directly, before they are diced and individually packaged. Many other variations will be apparent.

It can be seen that the invention offers a way to operate high density phase change memory that can be read by electrical circuitry directly but does not require complex electrical circuits for programming. The invention therefore provides a unique low power, fast read/write memory with simple electrical circuits.

As used herein, a given signal or value is "responsive" to a predecessor signal or value if the predecessor signal or value influenced the given signal or value. If there is an intervening processing element, step or time period, the given signal or value can still be "responsive" to the predecessor signal or value. If the intervening processing element or step combines more than one signal or value, the signal or value is considered "responsive" to each of the signal or value inputs. "Dependency" of a given signal, event or value upon another signal or value is defined similarly.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference in the Background section of this patent application are specifically incorporated by reference into the description herein of embodiments of the invention. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A method of operating a plurality of memory cells each including a respective region of phase change material having at least two electrically-distinguishable states, the two states for each of said regions having respective solid phases, said plurality of memory cells including a first memory cell that includes a first region of said phase change material, comprising the steps of:
    repeatedly scanning a laser spot across regions of said phase change material, said laser spot programming said first region of phase change material on respective different scans to be in different ones of said states; and
    reading the state of said first memory cell electronically.

2. A method according to claim 1, wherein said phase change material includes a chalcogenide.

3. A method according to claim 1, wherein during one of said scans said laser spot heats said first region such as to leave said first region in an amorphous phase.

4. A method according to claim 1, wherein during one of said scans said laser spot heats said first region such as to leave said first region in a crystalline phase.

5. A method according to claim 1, wherein said first region is in an amorphous phase in a first one of said states and in a crystalline phase in a second one of said states.

6. A method according to claim 5, wherein said step of reading the state of said first memory cell electronically comprises the step of distinguishing among at least said first and second states in dependence upon electrical resistance of said first region.

7. A method according to claim 1, wherein said step of reading the state of said first memory cell electronically comprises the step of distinguishing among at least said two electrically-distinguishable states in dependence upon electrical resistance of said region.

8. A method according to claim 1, wherein said laser spot heats said first region as it traverses said first region.

9. A method according to claim 1, wherein said first memory cell has an address, said address being represented by optically-distinguishable markings located at a fixed position relative to said first region on a structure supporting both said markings and said first region,
    further comprising the step of repeatedly scanning said laser spot across said markings in conjunction with said step of repeatedly scanning a laser spot across regions of said phase change material,
    and wherein said step of programming further comprises the steps of:
    optically detecting said markings during said step of scanning said laser spot across said markings; and
    delivering heating power via said laser spot at a predetermined time relative to said step of optically detecting said markings.

10. A memory device for use with a laser source for producing a laser spot, comprising:
    a support structure having a surface for receiving said laser spot, the support structure being rotatable relative to said laser spot; and
    an integrated circuit chip disposed on said surface so as to be scanned by said laser spot as said support structure rotates.

11. A device according to claim 10, wherein said support structure is rotatable about an axis parallel to a beam from said laser source.

12. A device according to claim 11, wherein said support structure comprises a disk, and said surface comprises a major surface of said disk.

13. A device according to claim 12, wherein said laser source is further moveable radially relative to said disk.

14. A device according to claim 10, wherein said support structure is rotatable about an axis perpendicular to a beam from said laser source.

15. A device according to claim 14, wherein said support structure comprises a cylinder, and said surface comprises an outer cylindrical surface of said cylinder.

16. A device according to claim 15, wherein said laser source is further moveable longitudinally relative to said cylinder.

17. A device according to claim 10, wherein said integrated circuit chip includes:
a first region of chalcogenide material having at least first and second states programmable at least in part by said laser source; and
memory read circuitry coupled electrically to said first region.

18. A device according to claim 17, wherein said first and second states are represented by amorphous and crystalline phases of said material, respectively.

19. A device according to claim 10, wherein said integrated circuit chip includes:
an array of memory cells each including a respective region of heat-programmable material having at least two solid phases, said integrated circuit chip being disposed on said support structure so that said laser spot will scan a row of said regions as said support structure rotates relative to said laser spot; and
memory read circuitry coupled to said regions.

20. A device according to claim 19, wherein said memory read circuitry distinguishes between said two solid phases for a given one of said memory cells in dependence upon the electrical resistance of the material of said given memory cell.

21. A device according to claim 19, wherein said integrated circuit chip further includes a plurality of bit positions disposed sequentially in-line with said row of regions, each of said bit positions having a marking that is optically distinguishable among at least two states.

22. A device according to claim 21, wherein said bit positions are all disposed together in an address region in-line with said row of regions.

23. A device according to claim 21, wherein said markings are distinguishable by their optical reflectivity.

24. A device according to claim 21, wherein each of said bit positions carries a metal line to indicate a first logical state or an oxide line to indicate a second logical state.

25. A device according to claim 10, wherein said integrated circuit chip includes a plurality of bit positions disposed sequentially in-line with a scanning trajectory of said laser spot as said support structure rotates, each of said bit positions having a marking that is optically distinguishable among at least two states.

26. A device according to claim 25, wherein said bit positions are all disposed together in an address region in-line with said scanning trajectory.

27. A device according to claim 26, wherein said markings are distinguishable by their optical reflectivity.

* * * * *